(12) United States Patent
Yang

(10) Patent No.: US 9,267,966 B2
(45) Date of Patent: Feb. 23, 2016

(54) TEST PLATFORM

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Yong-Sheng Yang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 285 days.

(21) Appl. No.: 14/093,055

(22) Filed: Nov. 29, 2013

(65) Prior Publication Data

US 2015/0137847 A1    May 21, 2015

(30) Foreign Application Priority Data

Nov. 19, 2013    (CN) .......................... 2013 1 05779370

(51) Int. Cl.
   *G01R 1/04*    (2006.01)
   *G01R 31/00*   (2006.01)
   *G01R 31/302*  (2006.01)

(52) U.S. Cl.
   CPC ............ *G01R 1/0458* (2013.01); *G01R 31/002* (2013.01); *G01R 31/3025* (2013.01)

(58) Field of Classification Search
   CPC .......... B23P 19/04; B23P 19/10; B23Q 3/103
   See application file for complete search history.

(56) References Cited

U.S. PATENT DOCUMENTS

| 4,767,109    | A  * | 8/1988  | Raketich ............. | B23Q 1/5468 269/61 |
| 5,676,360    | A  * | 10/1997 | Boucher ................ | B23Q 1/52 269/57 |
| 6,955,345    | B2 * | 10/2005 | Kato .................... | B23Q 1/5437 269/60 |
| 7,491,022    | B2 * | 2/2009  | Kato .................... | B23Q 1/287 269/71 |
| 2011/0163490 | A1 * | 7/2011  | Nagai ................. | B23K 37/0452 269/57 |
| 2013/0043632 | A1 * | 2/2013  | Sorabji ............. | H01L 21/67115 269/55 |
| 2015/0137847 | A1 * | 5/2015  | Yang .................... | G01R 31/003 324/756.02 |

* cited by examiner

*Primary Examiner* — Lee D Wilson
(74) *Attorney, Agent, or Firm* — Novak Druce Connolly Bove + Quigg LLP

(57) ABSTRACT

A test platform includes a base, a supporting member rotatably supported on the base, a laser emitter mounted on the base, and a laser receiver mounted to the supporting member and aligning with the laser emitter. The supporting member includes a network socket electrically connected to the laser receiver. The laser emitter is electrically connected to a network communication device.

8 Claims, 2 Drawing Sheets

TEST PLATFORM

BACKGROUND

1. Technical Field

The present disclosure relates to a test platform.

2. Description of Related Art

Electronic devices undergoing electromagnetic interference (EMI) tests may be placed on a round stage to get tested. The stage usually includes a plurality of wheels capable of rolling along a track, so that the stage can be rotated 360 degrees. A network socket is mounted on the stage to provide network connection for the electronic devices. A cable of the network socket is connected to a network signal source located away from the stage. However, the cable of the network socket is easily tangles and damaged when the stage is being rotated. Therefore, there is room for improvement in the art.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
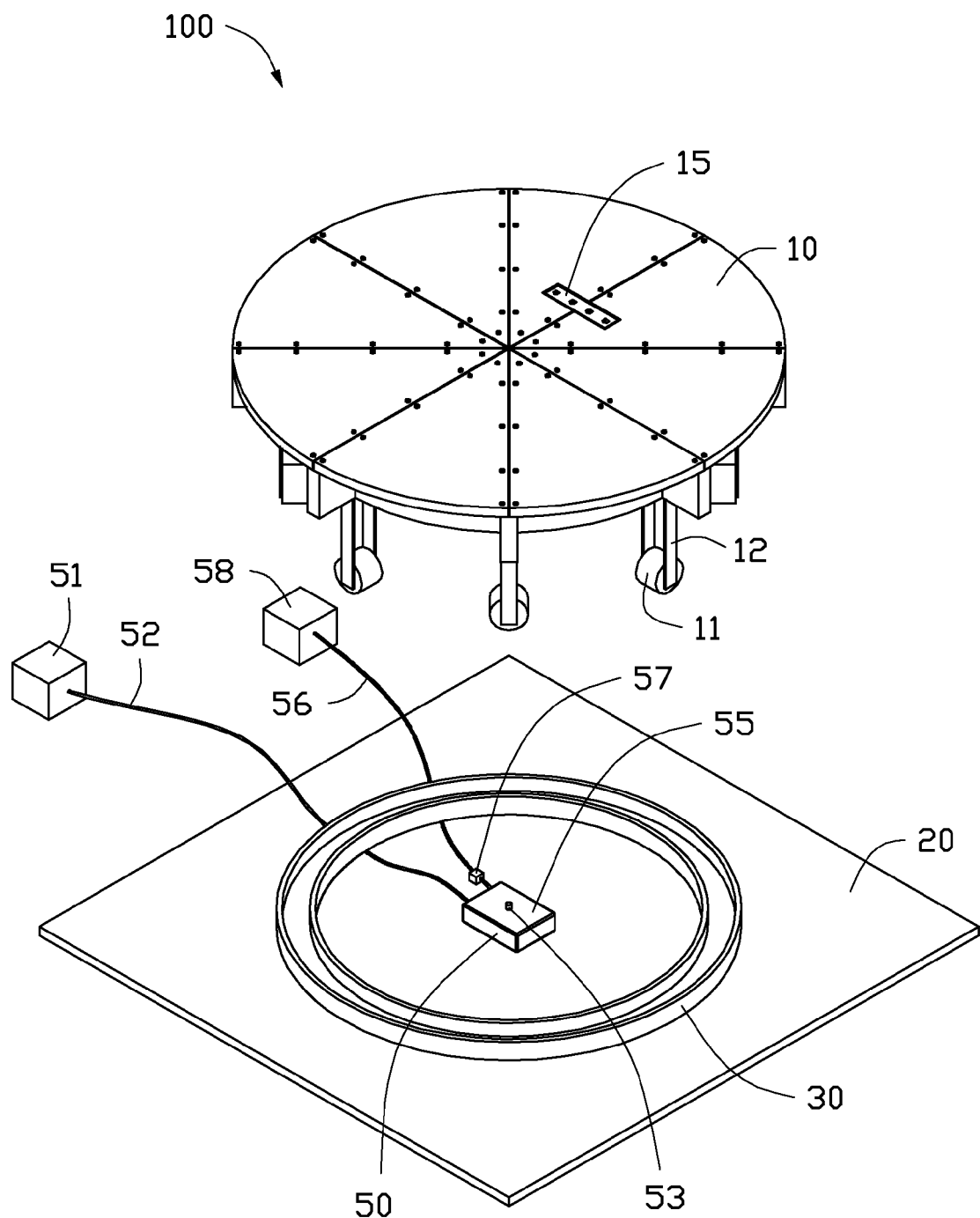
FIG. 1 is an exploded, isometric view of an embodiment of a test platform.
Figure 2:
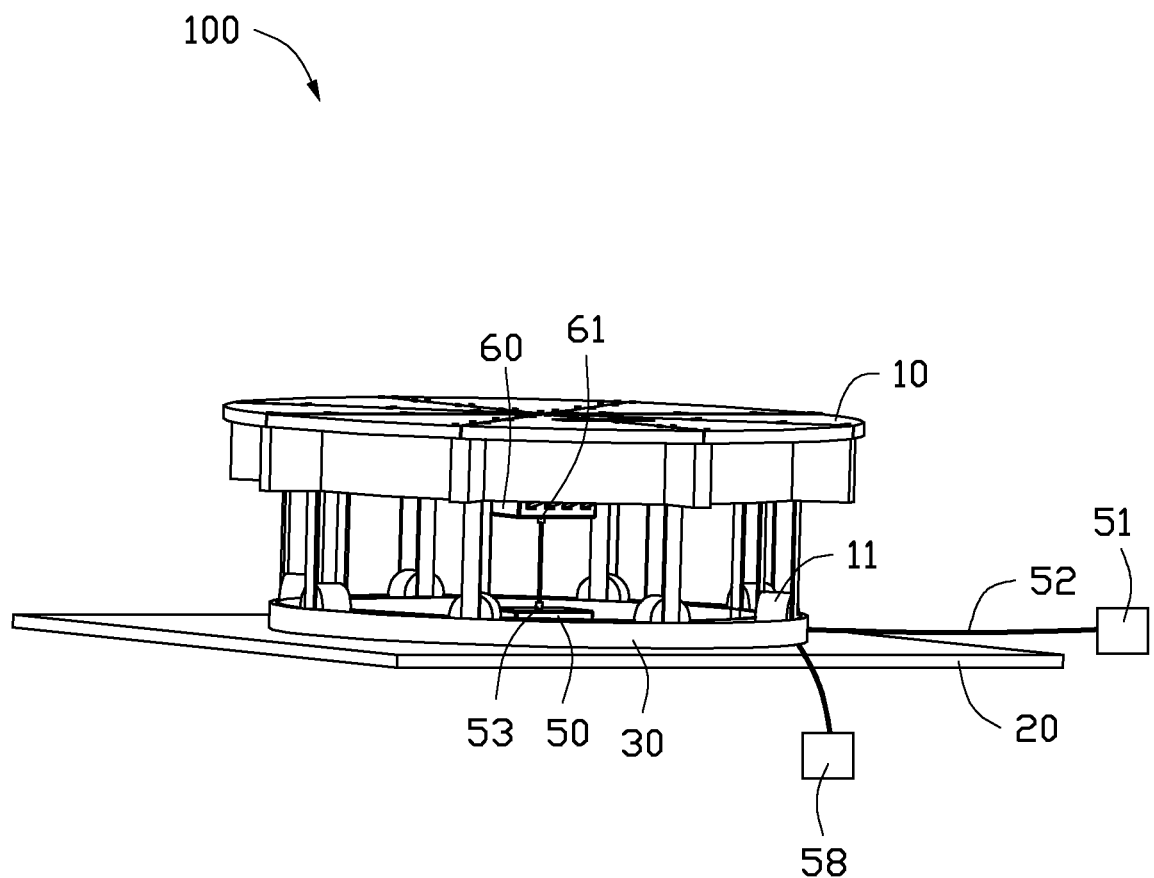
FIG. 2 is an assembled, isometric view of FIG. 1.

FIGS. 1 and 2 show an exemplary embodiment of a test platform 100 to support an electronic device undergoing electromagnetic interference (EMI) test thereon. The test platform 100 includes a base 20, an annular track 30 located on the base 20, a round supporting member 10, a laser emitter 50 located on the base 20, and a laser receiver 60 located on a bottom side of the supporting member 10. The track 30 comprises two concentric annular sliding rails. A rolling groove is defined between the two sliding rails.

A plurality of pairs of connection poles 12 extends from the supporting member 10, and a wheel 11 is rotatably mounted between each pair of connection poles 12. The wheels 11 are received in the rolling groove of the track 30 and can roll along the track 30 to rotate the supporting member 10. A network socket 15 is mounted to the supporting member 10 and exposed through a top side of the supporting member 10. The network socket 15 is electrically connected to the laser receiver 60.

The laser emitter 50 is surrounded by the track 30. The laser emitter 50 includes a metal housing 55 and a laser-emitting head 53 exposed through a top side of the laser emitter 50. A network communication device 51 is connected to the laser emitter 50 to provide network signals to the laser emitter 50. The network communication device 51 is connected to the laser emitter 50 through a cable 52 extending under a bottom of the track 30. An uninterruptible power supply (UPS) 58 is connected to the laser emitter 50 to supply power to the laser emitter 50. The UPS 58 is connected to the laser emitter 50 through a cable 56 extending under the bottom of the track 30. A power supply filter 57 is connected to the cable 56 for filtering power signals generated by the UPS 58.

The laser receiver 60 includes a laser-receiving head 61 aligning with the laser emitting head 53 of the laser emitter 50.

In use, the network signals of the network communication device 51 are emitted to the laser emitter 50, the network signals are converted to laser signals by the laser emitter 50, and the laser signals are emitted to the laser receiver 60 through the laser emitter 50. The laser signals are converted to network signals, and the network socket 15 obtains the network signals from the laser receiver 60 to provide a network connection for the electronic device without using cables to connect the supporting member 10 to the network communication device 51. A frequency of electromagnetic waves generated by the electronic device is different from a frequency of laser beams generated by the laser emitter 50, so that the laser emitter 50 does not interfere with an EMI test of the electronic device. The metal housing 55 shields electromagnetic waves generated by the laser emitter 50 to prevent the electromagnetic waves from interfering with the EMI test of the electronic device. When the supporting member 10 rotates, the laser receiver 60 rotates with the supporting member 10, and the wheels 11 roll along the track 30. Because the cable 52 and the cable 56 extend under the track 30, the cable 52 and the cable 56 are prevented from being tangled when the supporting member 10 rotates.

It is to be understood, that even though numerous characteristics and advantages of the embodiment have been set forth in the foregoing description, together with details of the structure and function of the embodiment, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A test platform, comprising:
   a base;
   a supporting member rotatably supported on the base, and comprising a network socket mounted on the supporting member;
   a laser emitter located on the base;
   a network communication device electrically connected to the laser emitter; and
   a laser receiver mounted on the supporting member and aligning with the laser emitter to receive network signals emitted from the laser emitter;
   wherein the network socket is electrically connected to the laser receiver.

2. The test platform of claim 1, further comprising an annular track located on the base, wherein the supporting member further comprises a plurality of wheels mounted to a bottom of the supporting member, and the plurality of wheels rolls along the track.

3. The test platform of claim 2, wherein the laser emitter is surrounded by the track.

4. The test platform of claim 1, further comprising an uninterruptible power supply (UPS) electrically connected to the laser emitter.

5. The test platform of claim 4, wherein the UPS is connected to the laser emitter through a cable.

6. The test platform of claim 5, further comprising a power supply filter connected to the cable.

7. The test platform of claim 1, wherein the laser emitter comprises a laser emitting head, the laser receiver comprises a laser receiving head aligning with the laser emitting head.

8. The test platform of claim 7, wherein the laser emitter comprises a metal housing, the laser emitting head is exposed through a top side of the metal housing.

\* \* \* \* \*